United States Patent
Liao et al.

(10) Patent No.: US 10,598,724 B2
(45) Date of Patent: Mar. 24, 2020

(54) TESTING SYSTEM FOR SEMICONDUCTOR PACKAGE COMPONENTS AND ITS THERMAL BARRIER LAYER ELEMENT

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 241 days.

(21) Appl. No.: 15/798,419

(22) Filed: Oct. 31, 2017

(65) Prior Publication Data
US 2019/0064258 A1 Feb. 28, 2019

(30) Foreign Application Priority Data
Aug. 28, 2017 (CN) .......................... 2017 1 0748478

(51) Int. Cl.
*G01R 31/10* (2006.01)
*G01R 31/28* (2006.01)
*G01R 1/04* (2006.01)

(52) U.S. Cl.
CPC ....... *G01R 31/2877* (2013.01); *G01R 1/0458* (2013.01); *G01R 31/2896* (2013.01)

(58) Field of Classification Search
CPC ............ G01R 31/0483; G01R 31/0466; G01R 31/28; G01R 31/2877; G01R 31/2896; G01R 31/2886; G01R 31/2887; G01R 31/0433; G01R 31/2893; G01R 31/2891; G01R 31/2851; G01R 31/043; G01R 31/31924; G01R 31/3004; G01R 31/2884; G01R 31/31922; G01R 1/0416; G01R 1/0441; G01R 1/0458; G01R 1/0466; G01R 1/7342; G01R 1/06705; G01R 1/06794;
(Continued)

(56) References Cited

U.S. PATENT DOCUMENTS 9,581,282 B1 * 2/2017 Ward .................... F16L 59/029
2002/0005569 A1 * 1/2002 Kobayashi ........... G01R 1/0466
257/666

(Continued)

FOREIGN PATENT DOCUMENTS

TW 201428302 A 7/2014

*Primary Examiner* — Thang X Le
(74) *Attorney, Agent, or Firm* — CKC & Partners Co., LLC

(57) ABSTRACT

A testing system for semiconductor package components includes a testing circuit board, a test socket, at least one probe pin and a thermal barrier layer element. The testing circuit board has at least one electrical contact. The test socket is used to receive a DUT. The probe pin is located on the test socket for contacting with the DUT. The thermal barrier layer element is located between the testing circuit board and the test socket, electrically connected to the probe pin and the electrical contact, and thermally isolated the electrical contact from the probe pin.

15 Claims, 7 Drawing Sheets

(58) Field of Classification Search
CPC .............. G01R 1/7314; G01R 1/06711; G01R 1/06772; G01R 1/06738; G01R 1/07314; G01R 1/07342
See application file for complete search history.

(56) References Cited

U.S. PATENT DOCUMENTS

| | | | |
|---|---|---|---|
| 2004/0145877 A1* | 7/2004 | Fujiyama | H01G 4/40 361/763 |
| 2006/0192577 A1* | 8/2006 | Matsunaga | H01L 23/49827 324/755.09 |
| 2011/0227595 A1* | 9/2011 | Takeshita | G01R 31/2889 324/756.02 |
| 2012/0000293 A1* | 1/2012 | Baughman | H02N 1/006 73/861.08 |
| 2014/0167806 A1* | 6/2014 | Ju | G01R 1/0458 324/756.02 |

* cited by examiner

TESTING SYSTEM FOR SEMICONDUCTOR PACKAGE COMPONENTS AND ITS THERMAL BARRIER LAYER ELEMENT

RELATED APPLICATIONS

This application claims priority to China Application Serial Number 201710748478.6, filed Aug. 28, 2017, which is herein incorporated by reference.

BACKGROUND

Field of Disclosure

The present disclosure relates to a testing system. More particularly, the present disclosure relates to a testing system for semiconductor package components.

Description of Related Art

In general, semiconductor package components (e.g., semiconductor package chips) will be electrically tested to ensure the quality of the semiconductor package components at the time of shipment after the semiconductor package components are made. While the semiconductor package components are electrically tested, a tested element (i.e., device under test, DUT) is disposed on a test socket of a testing device so that the DUT can be electrically connected to a load board with terminals (e.g., solder balls) for electrically testing the DUT.

However, when a DUT is tested on a test socket in a high temperature test, a testing personal often finds that the actual temperature of the DUT on the test socket is significantly lower than the predetermined temperature which is set by the testing device, thus, the testing data of the DUT in the high temperature test might not be accurate enough, so that the DUT cannot be tested in a predetermined temperature environment.

Given above, how to develop a solution for effectively overcoming the aforementioned inconvenience and shortages is a serious concern for many industries.

SUMMARY

One embodiment of the disclosure is to provide a thermal barrier layer element of a testing system. The thermal barrier layer element includes an insulation pad and at least one conductive thermal-isolation portion. The conductive thermal-isolation portion is formed on the insulation pad. The conductive thermal-isolation portion includes an aerogel having carbon nano tubes therein; or the conductive thermal-isolation portion includes a silica gel having carbon nano tubes therein.

Another embodiment of the disclosure is to provide a testing system for semiconductor package components. The testing system includes a testing circuit board, a test socket, at least one probe pin and a thermal barrier layer element. The testing circuit board is provided with at least one electrical contact. The test socket receives a DUT. The probe pin is disposed on the test socket for electrically connecting to the DUT and the electrical contact. The thermal barrier layer element is disposed between the probe pin and the electrical contact, electrically connected to the probe pin and the electrical contact, and configured to at least slow down heat transfer between the probe pin and the electrical contact.

The Other embodiment of the disclosure is to provide a testing system for semiconductor package components. The testing system includes a testing circuit board, a test socket, at least one probe pin and a thermal barrier layer element. The testing circuit board is provided with at least one electrical contact. The test socket having a recess which is configured to receive a DUT therein. The probe pin is disposed on the test socket for electrically connecting to the DUT and the electrical contact. The thermal barrier layer element is disposed within the recess to cover the probe pin for electrically connecting to the probe pin and the DUT, and configured to at least slow down heat transfer between the probe pin and the DUT.

Therefore, by the aforementioned testing systems, since the thermal barrier layer element is disposed between the probe pin and the electrical contact, or between the probe pin and the DUT, heats from the DUT and the test socket will not be dissipated towards the testing circuit board quickly. Thereby, not only reducing the possibilities of the testing data of the DUT being not accurate enough in the high temperature test, but also ensuring that the heat from the DUT and the test socket will not damage the testing circuit board.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
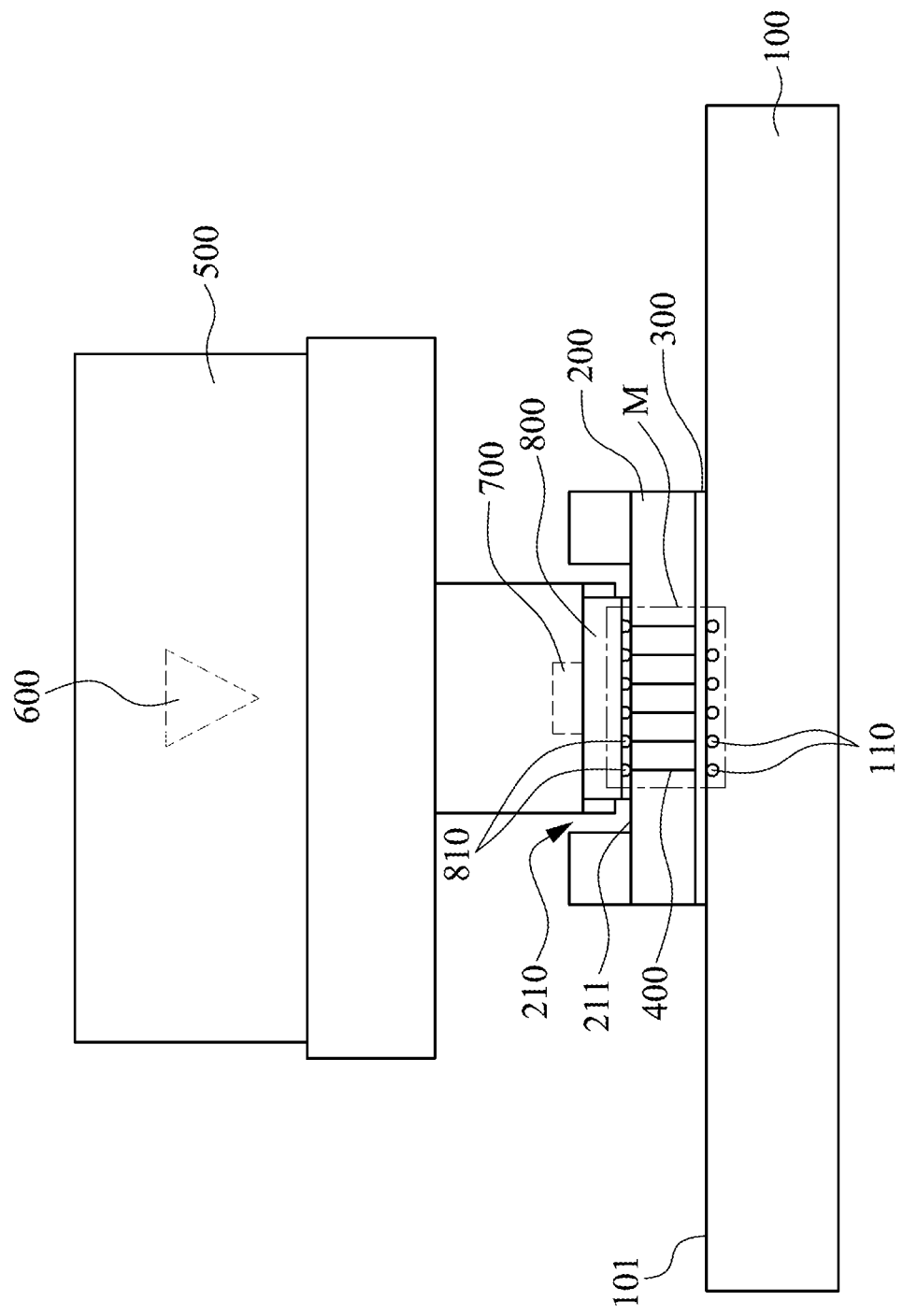
FIG. 1 is schematic side view of a testing system according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Since the actual temperature of the aforementioned semiconductor package component (device under test, called DUT hereinafter) on the test socket is always significantly lower than the predetermined temperature which is set by the testing device so that the testing data of the DUT might not be accurate enough in a predetermined temperature environment, the inventors of the disclosure have experimentally demonstrated that one part of the heat is dissipated towards the load board through the probe pins interposed between the test socket and the load board. In view of above, the disclosure is to provide a testing system having a thermal barrier layer element therein, which is capable of blocking or at least slowing down heat transfer operated between the DUT and the load board (i.e., heat transferred from the DUT to the load board or from the load board to the DUT) so that the DUT can be tested in the predetermined temperature environment so as to maintain the accuracy of the testing data of the DUT in the high temperature test.

Figure 2:
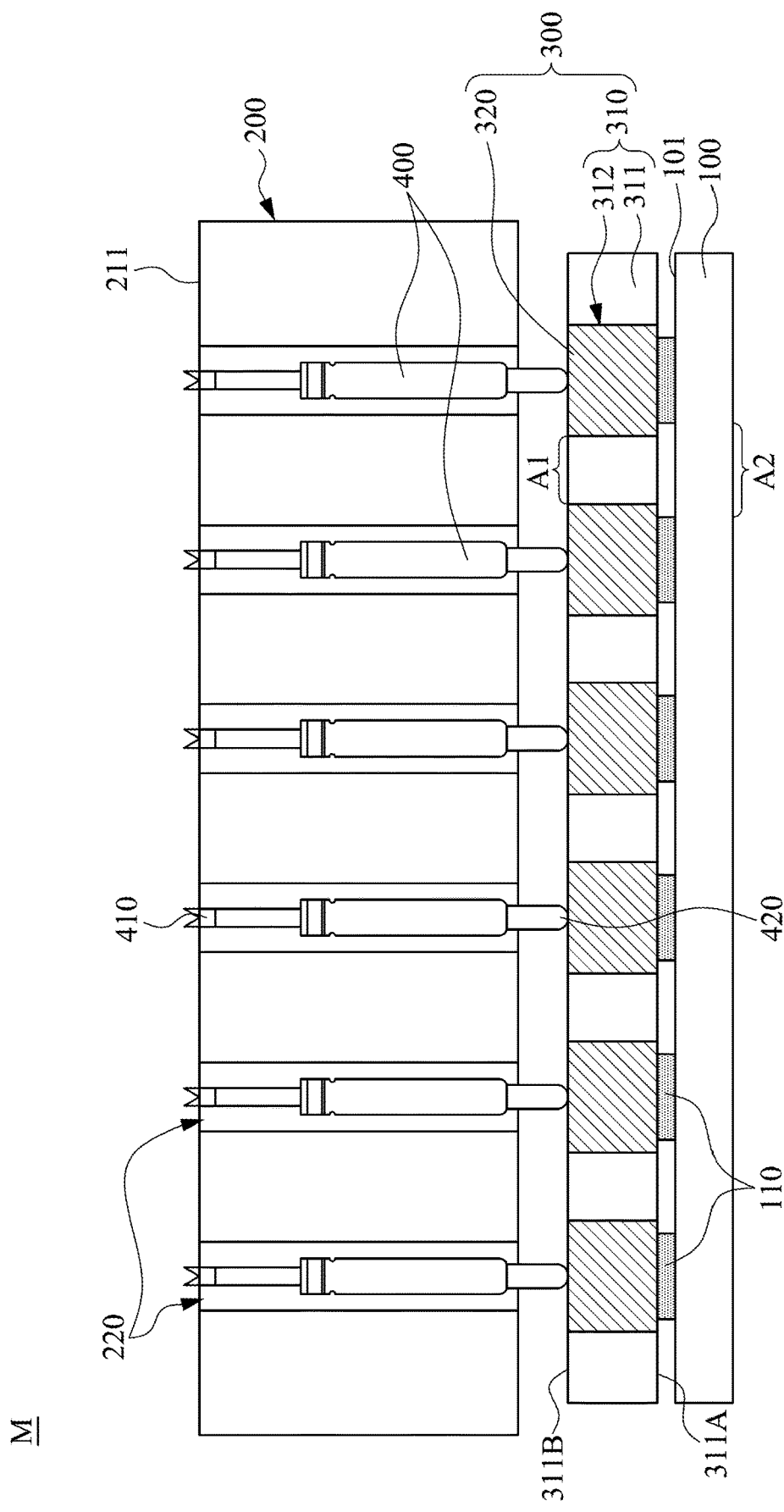
FIG. 2 is a partial enlarged view of an area M of FIG. 1.
Figure 3:
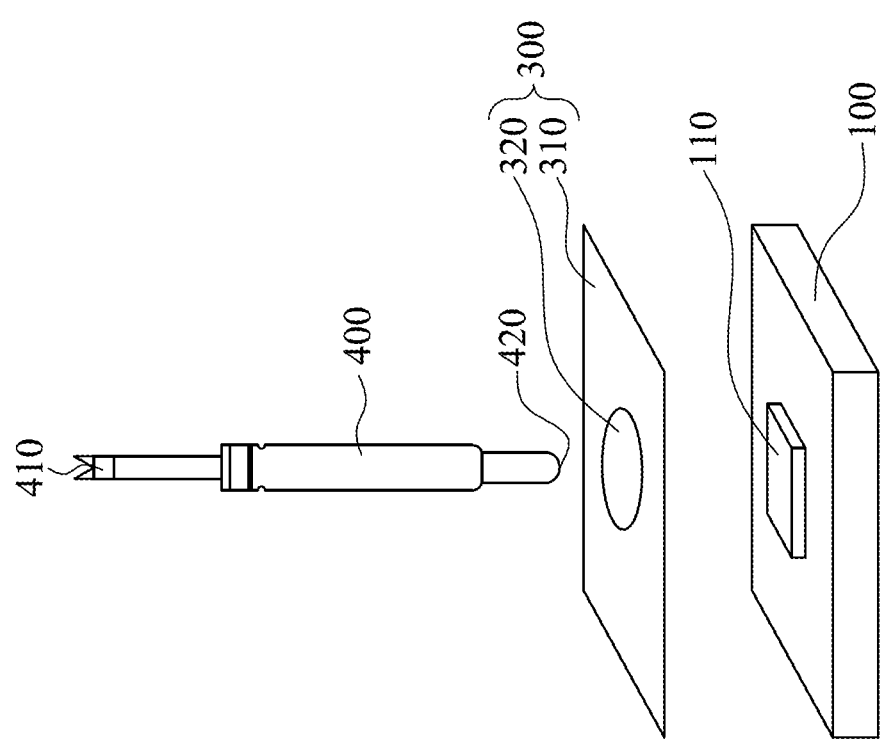
FIG. 3 is a partial exploded view of FIG. 2.

Reference is now made to FIG. 1 to FIG. 3 in which FIG. 1 is schematic side view of a testing system 10 according to one embodiment of the disclosure, FIG. 2 is a partial enlarged view of an area M of FIG. 1, and FIG. 3 is a partial exploded view of FIG. 2. As shown in FIG. 1 to FIG. 3, in the embodiment, the testing system 10 for semiconductor package components includes a testing circuit board 100, a test socket 200, a thermal barrier layer element 300 and plural probe pins 400. The testing circuit board 100 is provided with a plurality of electrical contacts 110. The electrical contacts 110 are respectively spaced to be arranged on one surface 101 of the testing circuit board 100. The test socket 200 is formed with a recess 210 for receiving a semiconductor package component (e.g., a semiconductor package chip, called DUT 800 hereinafter) therein. The probe pins 400 are installed in the test socket 200, and are spaced to be arranged in the test socket 200. Each of the probe pins 400 is in one of passages 220 of the test socket 200 so that one end (i.e., upper portion 410) of each of the probe pins 400 is extended into the recess 210 or at least exposed from the bottom surface 211 of the recess 210, the other end (i.e., lower portion 420) of each of the probe pins 400 is physically contacted the thermal barrier layer element 300. The probe pins 400 includes pogo pins, however, the disclosure is not limited thereto. The thermal barrier layer element 300 is interposed between the testing circuit board 100 and the test socket 200. The thermal barrier layer element 300 not only can be electrically connected to the probe pins 400 and the electrical contacts 110, but also can at least slow down the heat transfer between the probe pins 400 and the electrical contacts 110.

In the embodiment, specifically, the thermal barrier layer element 300 includes an insulation pad 310 and a plurality of conductive thermal-isolation portions 320. The insulation pad 310 is interposed between the testing circuit board 100 and the test socket 200. The conductive thermal-isolation portions 320 are respectively formed on the insulation pad 310. Each of the conductive thermal-isolation portions 320 is directly sandwiched between one of the electrical contacts 110 and one of the probe pins 400 for thermally isolating the probe pin 400 from the electrical contact 110. Specifically, the insulation pad 310 includes a pad body 311 and a plurality of receiving recess areas 312. The pad body 311 is provided with a first surface 311A and a second surface 311B which are opposite to each other, and the first surface 311A thereof is facing towards the testing circuit board 100. The receiving recess areas 312 are separately formed on the insulation pad 310, and each of the receiving recess areas 312 is connected to the first surface 311A and the second surface 311B of the pad body 311, respectively. Each of the conductive thermal-isolation portions is integrally formed within one of the receiving recess areas 312. A region A1 of the pad body 311 located between every two neighboring ones of the receiving recess areas 312 is corresponded to a region A2 of the surface 101 of the testing circuit board 100 located between every two neighboring ones of the electrical contacts 110.

In the embodiment, when manufacturing the thermal barrier layer element 300, the conductive thermal-isolation portions 320 which are already been solidified are arranged within a forming mold first. Next, liquid material of the insulation pad 310 is fully filled in the forming mold. After the insulation pad 310 is molded and solidified in the forming mold, the thermal barrier layer element 300 having the same thickness or different thickness thereof can be obtained after the mold is opened. Each of the conductive thermal-isolation portions 320 is fully filled in one of the receiving recess areas 312, and is flush with the first surface 311A and the second surface 311B of the pad body 311, respectively.

As shown in FIG. 1 and FIG. 2, the testing system 10 further includes a delivery arm 500 (e.g., handler test arm) for respectively carrying different DUT 800 to the test socket 200, and removing the DUT 800 from the test socket 200 after the test is finished. Therefore, when the delivery arm 500 moves a DUT 800 into the recess 210 such that a plurality of terminals 810 (e.g., solder balls) of the DUT 800 are respectively in contact with the upper portions 410 of the probe pins 400 one on one, at this moment, each of the terminals 810 of the DUT 800 can be electrically connected to one of the electrical contacts 110 of the testing circuit board 100 through the respective probe pin 400 and the respective conductive thermal-isolation portion 320.

During the testing process of the DUT 800, since the thermal barrier layer element 300 is sandwiched between the testing circuit board 100 and the test socket 200, the thermal barrier layer element 300 is able to provide thermal isolation between the probe pins 400 and the testing circuit board 100, or at least slow down the heat transfer from the probe pins 400 to the electrical contacts 110. Thus, heats from the position where the test socket 200 (including the DUT 800) is located will not be dissipated through the probe pins 400 quickly. Thereby, not only reducing the possibilities of the testing data of the DUT 800 being not accurate enough in the high temperature test, but also ensuring that the heats will not damage the testing circuit board 100.

Furthermore, the testing system 10 further includes a heater 600 and a thermal sensor 700. The heater 600 is disposed on the delivery arm 500 for heating the test socket 200 (including the DUT 800 therein) to a predetermined temperature so as to control the environmental temperature of the position where the test socket 200 (including the DUT 800) is located. The thermal sensor 700 is disposed on the delivery arm 500, or on the test socket 200 (not shown in figures) for sensing the temperature of the DUT 800. However, the disclosure is not limited to be mandatorily equipped with the heater and the thermal sensor 700 on the system if only considering the goal for protecting the testing circuit board from thermal damage.

Figure 4:
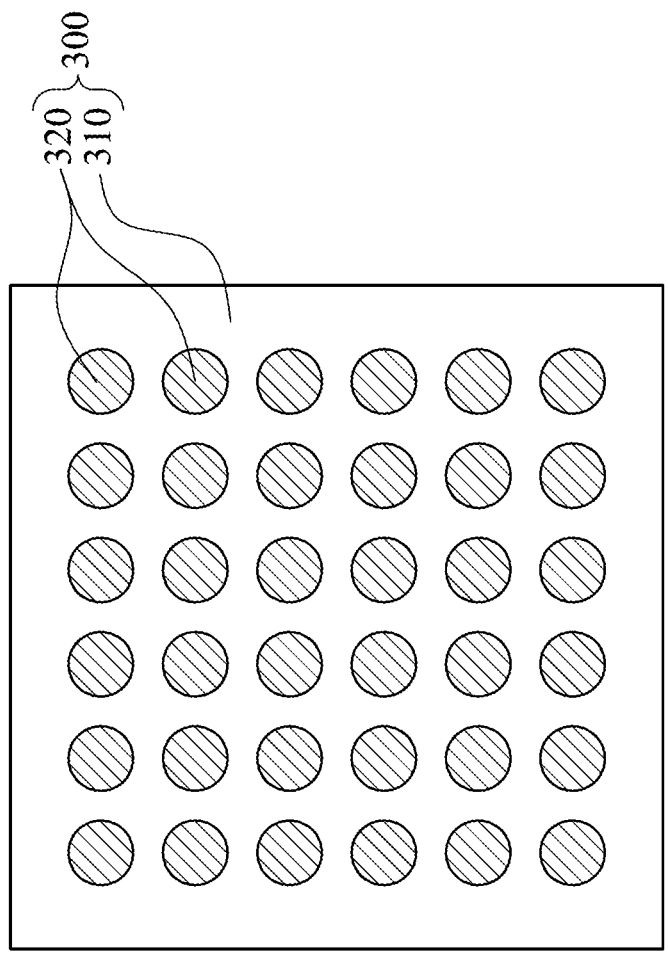
FIG. 4 is a top view of the thermal barrier layer element of FIG. 1.

FIG. 4 is a top view of the thermal barrier layer element 300 of FIG. 1. As shown in FIG. 4, the conductive thermal-isolation portions 320 are spaced to be arranged on the insulation pad 310, for example but not limited thereto, the conductive thermal-isolation portions 320 are arranged on the insulation pad 310 in a matrix form. However, as long as the arrangements of the terminals 810 of the DUT 800, the probe pins 400 and the electrical contacts 110 of the testing circuit board 100 in cooperative harmony, the arrangement of the conductive thermal-isolation portions 320 are unnecessary to be limited as above. Also, the insulation pad 310 is formed in a rectangular shape, each of the conductive thermal-isolation portions 320 is formed in a circular shape, and the area size of the insulation pad 310 is not greater than the area size of a bottom surface of the test socket 200, however, the disclosure is not limit to the shape of the insulation pad 310 and the conductive thermal-isolation portions 320, and the size of the insulation pad 310.

In the embodiment, the material of the conductive thermal-isolation portions 320 comprises a nano-class carbon-tube aerogel, which is an aerogel having carbon nano tubes therein. The carbon-tube aerogel is a very light and flexible solid material. Because the structure of the carbon-tube aerogel is hard and firm, the carbon-tube aerogel is able to support more than 100 times the weight of its weight. Also, the carbon-tube aerogel is a porous ultralight material, and has a large number of pores (not greater than 100 nm each). The pores are widely distributed thereon, and are with good permeability.

In addition, unlike other gels, since the carbon nano tubes of the aerogel of the embodiment are with chain linkage property, conductors on either side of each of the aforementioned conductive thermal-isolation portions can be electrically connected. Therefore, the nano-class carbon-tube aerogel not only can be electrically conductive, but also can block the heat transfer supposed to go through for providing good thermal barrier capability. However, the disclosure is not limited thereto, in another embodiment, as long as the thermal barrier layer element is with conductive and thermal insulation (or low thermal conductivity) characteristics at the same time, the material of the conductive thermal-isolation portions also can be selected as a nano-class carbon-tube silica gel which is a silica gel having carbon nano tubes therein.

Figure 5:
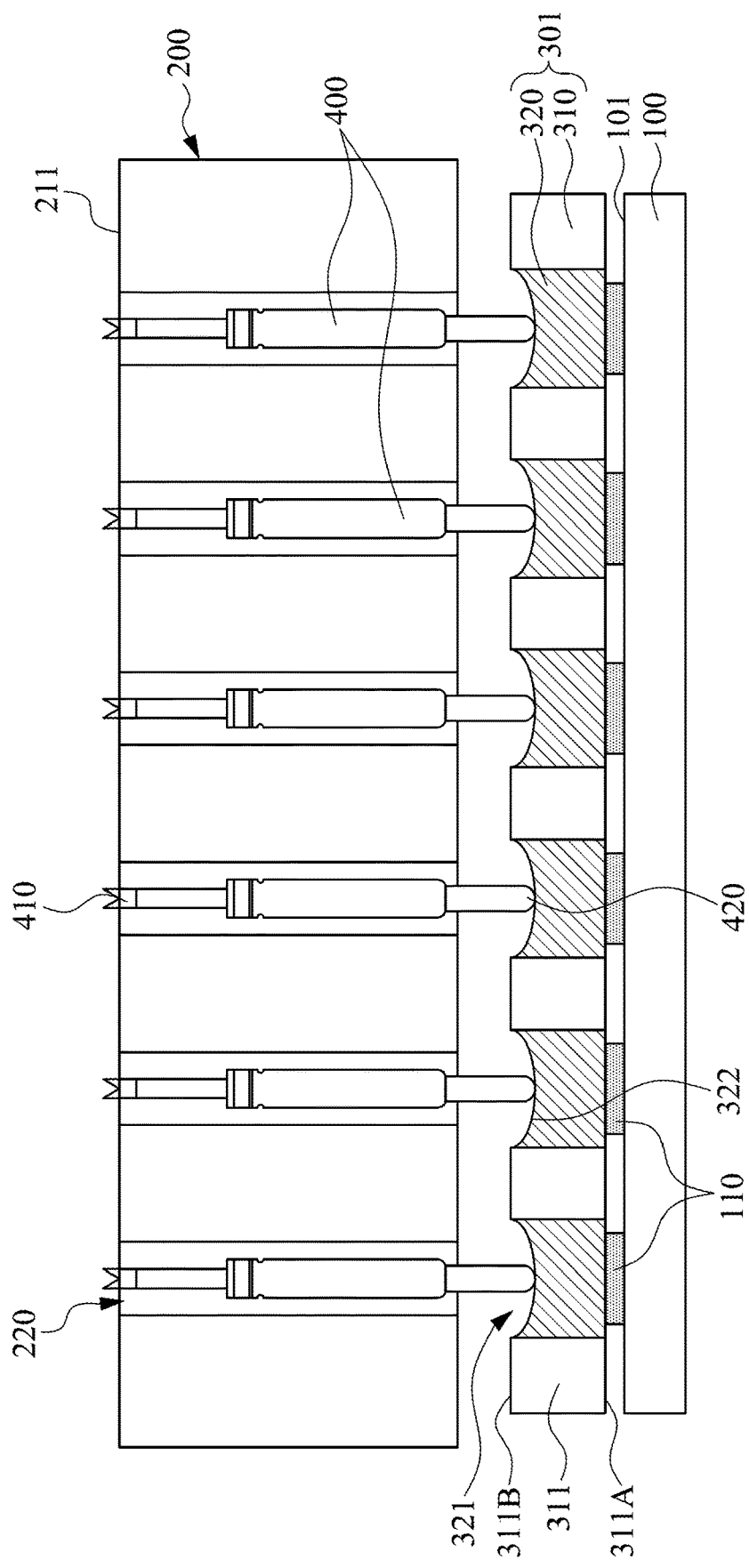
FIG. 5 is a partial enlarged view of a testing system according to one embodiment of the disclosure.

FIG. 5 is a partial enlarged view of a testing system 11 according to one embodiment of the disclosure. As shown in FIG. 5, the thermal barrier layer element 301 in FIG. 5 is substantially the same to the thermal barrier layer element 300 in FIG. 2 in which the same elements are given the same numerical references in FIG. 5, however, at least one difference between the thermal barrier layer element 301 in FIG. 5 and the thermal barrier layer element 300 in FIG. 2 is: at least one or every one of the conductive thermal-isolation portions 320 is formed with a concave portion 321 at one surface of the conductive thermal-isolation portion 320 facing towards the probe pins 400. Each of the concave portions 321 is formed with a curved bottom surface 322, and the curved bottom surface 322 is connected to the second surface 311B of the pad body 311. Each of the probe pins 400 extends into one of the concave portions 321 to physical contact the respective curved bottom surface 322. Since the curved bottom surface 322 is with a specific curvature, each of the probe pins 400 extended in the respective concave portion 321 will not be easily disengaged from the respective conductive thermal-isolation portion 320 so as to position in the respective conductive thermal-isolation portion 320, thereby maintaining the electrical conduction performance.

Figure 6:
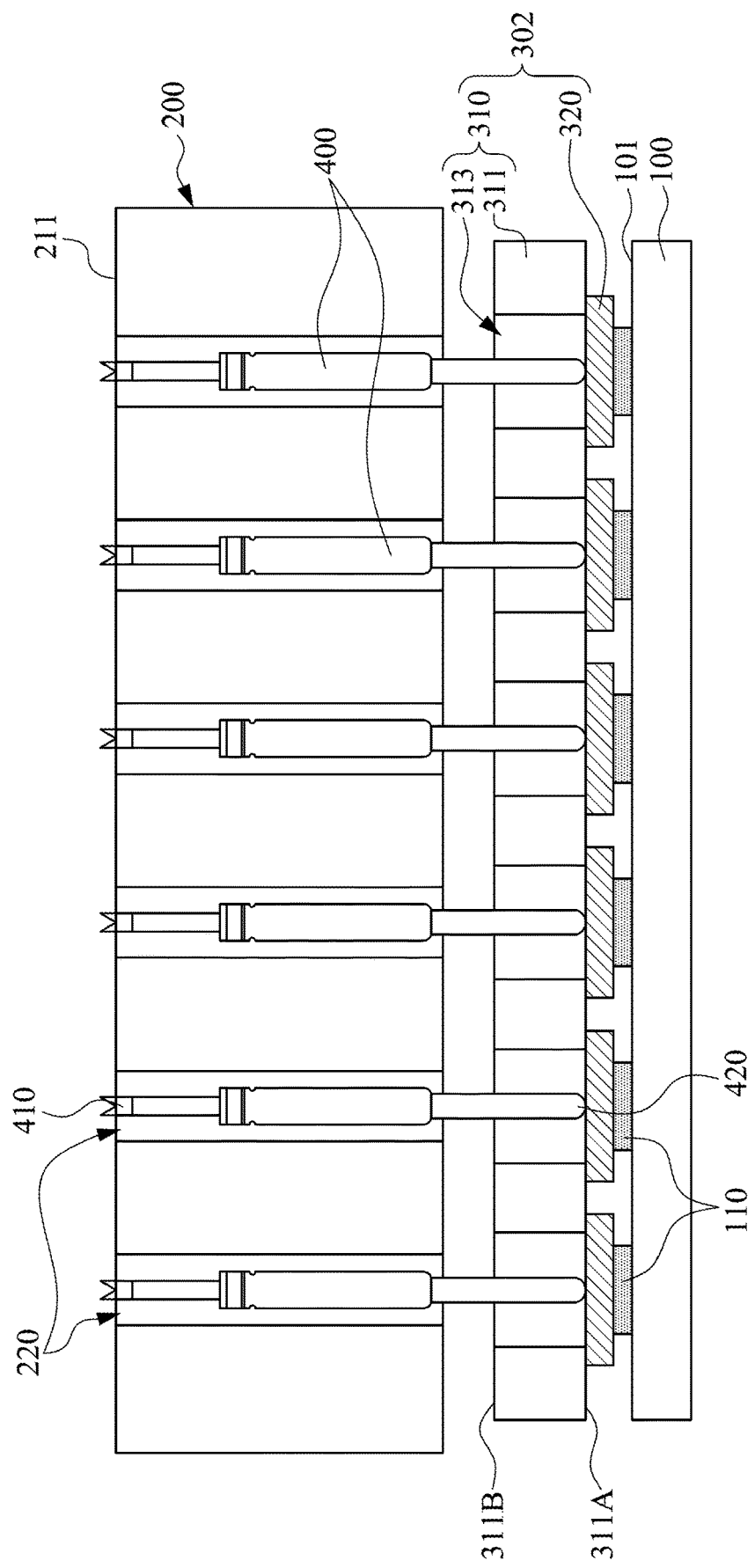
FIG. 6 is a partial enlarged view of a testing system according to one embodiment of the disclosure.

FIG. 6 is a partial enlarged view of a testing system 12 according to one embodiment of the disclosure. As shown in FIG. 6, the thermal barrier layer element 302 in FIG. 6 is substantially the same to the thermal barrier layer element 300 in FIG. 2 in which the same elements are given the same numerical references in FIG. 6, however, at least one difference between the thermal barrier layer element 302 in FIG. 6 and the thermal barrier layer element 300 in FIG. 2 is, that the insulation pad 310 includes a pad body 311 and a plurality of through holes 313. The pad body 311 is provided with a first surface 311A and a second surface 311B which are opposite to each other, and the first surface 311A thereof is facing towards the testing circuit board 100. The through holes 313 are separately formed on the insulation pad 310, and each of the through holes 313 penetrates through the pad body 311 to be connected to the first surface 311A and the second surface 311B of the pad body 311, respectively. Each of the conductive thermal-isolation portions 320 covers the first surface 311A of the insulation pad 310 and one of the through holes 313 so that each of the probe pins 400 extends into one of the through holes 313 to be in contact with the conductive thermal-isolation portion 320 which covers the respective through hole 313. Since each of the probe pins 400 is effectively held in the respective through hole 313, each of the probe pins 400 can be in contact with the respective conductive thermal-isolation portion 320 in the respective through hole 313, and will not be easily disengaged from the respective conductive thermal-isolation portion 320, thereby maintaining the electrical conduction performance.

Furthermore, in another embodiment, at least one or every one of the conductive thermal-isolation portions 320 is formed with a concave portion 321 of FIG. 5 at one surface of the respective conductive thermal-isolation portion 320 facing towards the through hole 313 so as to reduce the possibilities of the probe pin 400 sliding on the conductive thermal-isolation portion 320.

Figure 7:
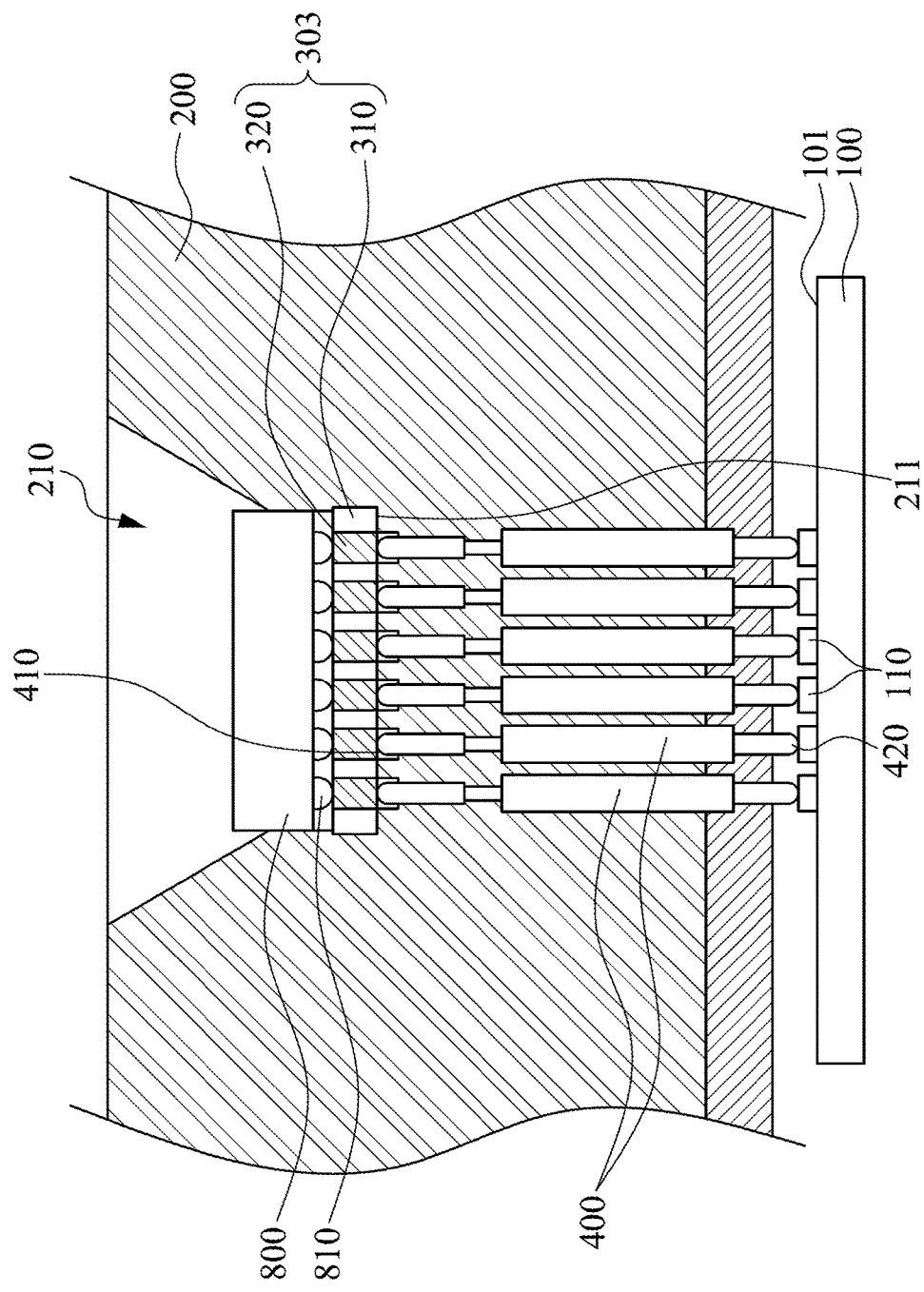
FIG. 7 is a schematic side view of a testing system according to one embodiment of the disclosure.

FIG. 7 is a schematic side view of a testing system 13 according to one embodiment of the disclosure. As shown in FIG. 7, the testing system 13 of FIG. 7 is substantially the same to the testing system 10 of FIG. 1 in which the same elements are given the same numerical references in FIG. 7, however, thermal barrier layer element 303 of FIG. 7 is not interposed between the testing circuit board 100 and the test socket 200, thermal barrier layer element 303 of FIG. 7 is disposed within a recess 210 of the test socket 200. Thermal barrier layer element 303 of FIG. 7 is disposed on a bottom surface 211 of the recess 210 to cover the probe pins 400 for electrically connecting the probe pins 400 and the DUT 800, and at least slowing down the heat transfer between the probe pins 400 and the DUT 800.

Therefore, when a DUT 800 is moved into the recess 210, the thermal barrier layer element 303 is directly interposed between the DUT 800 and the probe pins 400 so that each of the conductive thermal-isolation portions 320 is directly sandwiched between one of the terminals 810 (e.g., solder balls) of the DUT 800 and one of the probe pins 400, that is, each of the conductive thermal-isolation portions 320 is in physical contact with one of the terminals 810 of the DUT 800 and one of the probe pins 400. At this moment, since each of the lower portions 420 of the probe pins 400 is in direct contact with one of the electrical contacts 110 of the testing circuit board 100, each of the terminals 810 of the DUT 800 can be electrically connected to one of the electrical contacts 110 of the testing circuit board 100 through the respective conductive thermal-isolation portion 320 and the respective probe pin 400.

During the testing process of the DUT 800, since the thermal barrier layer element 303 is sandwiched between the DUT 800 and the probe pins 400, heat from the position where the test socket 200 (including the DUT 800) is located can be effectively avoided from being dissipated through the probe pins 400 quickly. Thereby, not only reducing the possibilities of the testing data of the DUT 800 being not accurate enough in the high temperature test, but also ensuring that the heats will not damage the testing circuit board 100.

In addition, in the embodiment, the testing system 13 is also configured with a suitable positioning mechanism such that the thermal barrier layer element 303 can be fixed within the recess 210 without being removed or displaced within the testing process of the DUT 800. The positioning mechanism described above can fix the thermal barrier layer element 303 on the bottom surface 211 of the recess 210, for example, by a clipping or bonding method. However, the disclosure is not limited thereto.

It is noted, it is apparent to those skilled in the art to modify the thermal barrier layer element 303 of FIG. 7 to be the thermal barrier layer elements 300 to 302 of FIG. 2, FIG. 5 or FIG. 6 in accordance with any requirement and limitation.

Therefore, by the aforementioned testing systems, no matter the thermal barrier layer element is disposed between the probe pin and the electrical contact, or between the probe pin and the DUT, heats on the DUT and the test socket will not be dissipated towards the testing circuit board quickly. Thereby, not only reducing the possibilities of the testing data of the DUT being not accurate enough in the high temperature test, but also ensuring that the heats will not damage the testing circuit board.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A thermal barrier layer element of a testing system, comprising:
   an insulation pad comprising a pad body having two opposite surfaces thereon, and at least one through hole that is formed on the pad body and connected to the two opposite surfaces of the Dad body; and
   at least one electrically conductive thermal-isolation portion formed on the insulation pad, wherein the at least one electrically conductive thermal-isolation portion is integrally formed within the at least one through hole, or covers the at least one through hole and one of the two opposite surfaces of the pad body, and
   the at least one electrically conductive thermal-isolation portion comprises an aerogel having carbon nano tubes therein, or the at least one electrically conductive thermal-isolation portion comprises a silica gel having carbon nano tubes therein.

2. The thermal barrier layer element of claim 1, wherein the at least one electrically conductive thermal-isolation portion is a plurality of electrically conductive thermal-isolation portions, and the plurality of electrically conductive thermal-isolation portions are spaced to be arranged on the insulation pad.

3. The thermal barrier layer element of claim 2, wherein the plurality of electrically conductive thermal-isolation portions are arranged in a matrix form.

4. The thermal barrier layer element of claim 1, wherein a surface of the at least one electrically conductive thermal-isolation portion is formed with a concave portion.

5. A testing system for semiconductor package components, comprising:
   a testing circuit board provided with at least one electrical contact;
   a test socket for receiving a device under test (DUT);
   at least one probe pin disposed on the test socket for electrically connecting to the DUT and the at least one electrical contact; and
   a thermal barrier layer element disposed between the at least one probe pin and the at least one electrical contact, electrically connected to the at least one probe pin and the at least one electrical contact, and configured to at least slow down heat transfer between the at least one probe pin and the at least one electrical contact.

6. The testing system for the semiconductor package components of claim 5, wherein the thermal barrier layer element comprises:
   an insulation pad sandwiched between the testing circuit board and the test socket; and
   at least one electrically conductive thermal-isolation portion formed on the insulation pad, directly sandwiched between the at least one probe pin and the at least one electrical contact for thermally isolating the at least one probe pin from the at least one electrical contact.

7. The testing system for the semiconductor package components of claim 6, wherein the insulation pad comprises a pad body having two opposite surfaces thereon, and at least one receiving recess area formed on the pad body and connected to the two opposite surfaces of the pad body, wherein the at least one electrically conductive thermal-isolation portion is integrally formed within the receiving recess area.

8. The testing system for the semiconductor package components of claim 6, wherein the insulation pad comprises a pad body and at least one through hole penetrating through the pad body to be connected to two opposite surfaces of the pad body, wherein the at least one electrically conductive thermal-isolation portion covers the through hole and one of the two opposite surfaces of the pad body, and the at least one probe pin extends into the through hole to be in contact with the at least one electrically conductive thermal-isolation portion.

9. The testing system for the semiconductor package components of claim 6, wherein the at least one electrically conductive thermal-isolation portion is a plurality of electrically conductive thermal-isolation portions, the at least one electrical contact is a plurality of electrical contacts, and the at least one probe pin is a plurality of probe pins, the plurality of electrically conductive thermal-isolation portions are spaced to be arranged on the insulation pad, and each of the plurality of electrically conductive thermal-isolation portions is sandwiched between one of the plurality of electrical contacts and one of the plurality of probe pins.

10. The testing system for the semiconductor package components of claim 9, wherein the plurality of electrically conductive thermal-isolation portions are arranged in a matrix form.

11. The testing system for the semiconductor package components of claim 6, wherein a surface of the at least one electrically conductive thermal-isolation portion is formed with a concave portion, and the at least one probe pin extends into the concave portion.

12. The testing system for the semiconductor package components of claim 6, wherein the at least one electrically conductive thermal-isolation portion comprises an aerogel having carbon nano tubes therein, or the at least one electrically conductive thermal-isolation portion comprises a silica gel having carbon nano tubes therein.

13. A testing system for semiconductor package components, comprising:
- a testing circuit board provided with at least one electrical contact;
- a test socket having a recess configured to receive a device under test (DUT);
- at least one probe pin disposed on the test socket for electrically connecting to the DUT and the electrical contact; and
- a thermal barrier layer element disposed within the recess to cover the at least one probe pin for electrically connecting to the at least one probe pin and the DUT, and configured to at least slow down heat transfer between the at least one probe pin and the DUT.

14. The testing system for the semiconductor package components of claim 13, wherein the thermal barrier layer element comprises:
- an insulation pad sandwiched between the at least one probe pin and the DUT; and
- at least one electrically conductive thermal-isolation portion formed on the insulation pad, directly sandwiched between one of terminals of the DUT and the at least one probe pin for thermally isolating the at least one probe pin from the terminal of the DUT.

15. The testing system for the semiconductor package components of claim 14, wherein the at least one electrically conductive thermal-isolation portion comprises an aerogel having carbon nano tubes therein, or
- the at least one electrically conductive thermal-isolation portion comprises a silica gel having carbon nano tubes therein.

* * * * *